United States Patent
Toosky

(10) Patent No.: US 7,043,033 B1
(45) Date of Patent: May 9, 2006

(54) MODE CONTROL FOR AUDIO AMPLIFIER COUPLING

(75) Inventor: Zabih Toosky, Santa Cruz, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 941 days.

(21) Appl. No.: 10/098,227

(22) Filed: Mar. 15, 2002

(51) Int. Cl.
*H03F 21/00* (2006.01)

(52) U.S. Cl. .................... 381/120; 381/94.5; 330/51; 330/295; 330/296; 330/297; 330/298

(58) Field of Classification Search ............... 381/120, 381/94.5; 330/51, 298, 295, 296–7; 363/50, 363/79; 307/22, 25–28
See application file for complete search history.

(56) References Cited

U.S. PATENT DOCUMENTS

| | | | | |
|---|---|---|---|---|
| 3,944,941 A | * | 3/1976 | Tsuda | 330/51 |
| 4,446,440 A | * | 5/1984 | Bell | 330/51 |
| 5,541,553 A | * | 7/1996 | Chujo et al. | 330/51 |
| 5,642,074 A | * | 6/1997 | Ghaffaripour et al. | 330/51 |
| 5,729,174 A | * | 3/1998 | Dunnebacke et al. | 330/51 |

OTHER PUBLICATIONS

"LM4911 Boomer Stereo 40mW headphone Amplifier with Selectable Capacitive Coupled or OCL Output," National Semiconductor, Jul. 2001, pp. 1-5.

"LM4901 Boomer 1 Watt Audio Power Amplifier with Selectable Shutdown Logic Level," National Semiconductor, Dec. 2001, pp. 1-21.

"LM4910 Boomer Output Capacitor-less Stereo 35mW Headphone Amplifier," National Semiconductor, Jan. 2002, pp. 1-19.

* cited by examiner

*Primary Examiner*—Xu Mei
*Assistant Examiner*—Douglas Suthers
(74) *Attorney, Agent, or Firm*—Brett A. Hertzberg; Merchant & Gould P.C.

(57) ABSTRACT

An audio amplifier system includes two amplifiers that are configured to drive loads through either DC or AC coupling. A third amplifier provides an AC ground return when the system is configured in the DC coupled mode, and is disabled when the system is configured in the AC coupled mode. A bypass circuit charges a bypass capacitor to provide a reference voltage level for the amplifiers. A mode detection circuit monitors the reference voltage level and the output of the third amplifier to determine the current operating mode. The third amplifier is disabled when the reference voltage exceeds the output of the third amplifier or when a shutdown condition is activated, such that the third amplifier is protected from short circuit conditions. The charge and discharge times of the bypass capacitor relate to the detected operating mode minimize click and pop in the amplified signals.

20 Claims, 6 Drawing Sheets

MODE CONTROL FOR AUDIO AMPLIFIER COUPLING

FIELD OF THE INVENTION

The present invention relates to a method and apparatus for an audio amplifier system that is arranged to provide audio output signals through both AC coupled (i.e., capacitively coupled), and DC coupled (i.e., capless) means. In particular, the present invention relates to a method and apparatus that detects an operating mode of the audio amplifier system by monitoring various voltages associated with the amplifiers, wherein the operating mode corresponds to either AC coupled or DC coupled.

BACKGROUND OF THE INVENTION

A conventional audio amplifier system (100) is illustrated in FIG. 1. The audio amplifier system (100) includes three operation amplifiers (AMP10–AMP12), two signal-coupling capacitors (CIN1–CIN2), six resistors (R11–R16), and two speakers (SPK1–SPK2).

Resistors R15 and R16 are series connected between VHI and GND, forming a resistor divider that produces a reference voltage (VREF). The reference voltage is coupled to the non-inverting inputs of amplifiers AMP10–AMP12. Amplifier AMP11 is arranged to operate as a buffer such that a buffered version of the reference voltage is provided to node OUT3.

The reference voltage (VREF) is necessary to bias the amplifiers in their optimal common mode range, such that a maximum voltage swing is available between the amplifiers output nodes. Since the amplifiers are biased into their optimal performance range by the reference voltage (VREF), it is necessary isolate the DC level of the input signal from the amplifier. Signal-coupling capacitors CIN1 and CIN2 are arranged to provide DC isolation between the input signals and the biasing condition for the amplifiers.

Amplifier AMP10, resistor R11, and resistor R12 are arranged to operate as an inverting amplifier (X1). Inverting amplifier X1 receives audio input signal IN1 via signal coupling capacitor CIN1. The gain associated with inverting amplifier X1 is determined by resistors R11 and R12. An output signal is provided by inverting amplifier X1 at node OUT1 in response to input signal IN1. Inverting amplifier X1 drives speaker SPK1 between nodes OUT1 and OUT3.

Amplifier AMP12, resistor R13, and resistor R14 are arranged to operate as another inverting amplifier (X2). Inverting amplifier X2 receives audio input signal IN2 via signal-coupling capacitor CIN2. The gain associated with inverting amplifier X2 is determined by resistors R13 and R14. An output signal is provided by inverting amplifier X2 at node OUT2 in response to input signal IN2. Inverting amplifier X2 drives speaker SPK2 between nodes OUT2 and OUT3.

SUMMARY OF THE INVENTION

Briefly stated, an audio amplifier system includes two amplifiers that are configured to drive loads through either DC or AC coupling. A third amplifier provides an AC ground return when the system is configured in the DC coupled mode, and is disabled when the system is configured in the AC coupled mode. A bypass circuit charges a bypass capacitor to provide a reference voltage level for the amplifiers. A mode detection circuit monitors the reference voltage level and the output of the third amplifier to determine the current operating mode. The third amplifier is disabled when the reference voltage exceeds the output of the third amplifier or when a shutdown condition is activated, such that the third amplifier is protected from short circuit conditions. The charge and discharge times of the bypass capacitor relate to the detected operating mode minimize click and pop in the amplified signals.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

The present invention is apparatus and method related to a two-channel amplifier that may be dynamically configured for driving AC coupled and DC coupled loads such as headphones and speakers. A first amplifier is arranged to provide amplification of the first channel to a first load, while a second amplifier is arranged to provide amplification of the second channel to a second load. A third amplifier is arranged to provide a ground return for the loads on the first and second channels when the output signals are DC coupled to the loads. The third amplifier is disabled when the loads are AC coupled such that power consumption is minimized. The output of the third amplifier is coupled to ground when the two-channel amplifier is configured to drive an AC coupled load. By providing a suitable circuit in accordance with the present invention, the operating mode of the two-channel amplifier may be dynamically determined. When the output pin of the third amplifier is shorted to ground, the third amplifier is disabled. A bypass voltage generator is arranged to provide the reference voltage for the amplifiers by charging a bypass capacitor to a predetermined voltage. The rate that the bypass capacitor is charged may be dynamically changed according to the operating mode that is detected. The charging rate of the capacitors in the system are arranged to minimize click and pop that may result on the loads.

In an audio amplifier application, speakers and/or headphones are typically driven with an AC signal since the AC signal produces acoustic energy. DC signals are typically avoided in driving the speakers since the DC energy is wasted and may cause excessive heating and/or damage to the speakers. Speakers are typically driven by AC coupling via capacitors that require additional expense either as external components to the audio amplifier, or at the expense of additional die area in an integrated circuit solution. The present invention detects the operating mode of the system and configures the amplifiers to operate in either a DC coupled mode or an AC coupled mode without requiring a separate detection terminal (or pin), and while providing short circuit protection, as will be described below. An overview of the present invention is shown in FIG. 2.

System Overview

Figure 1:
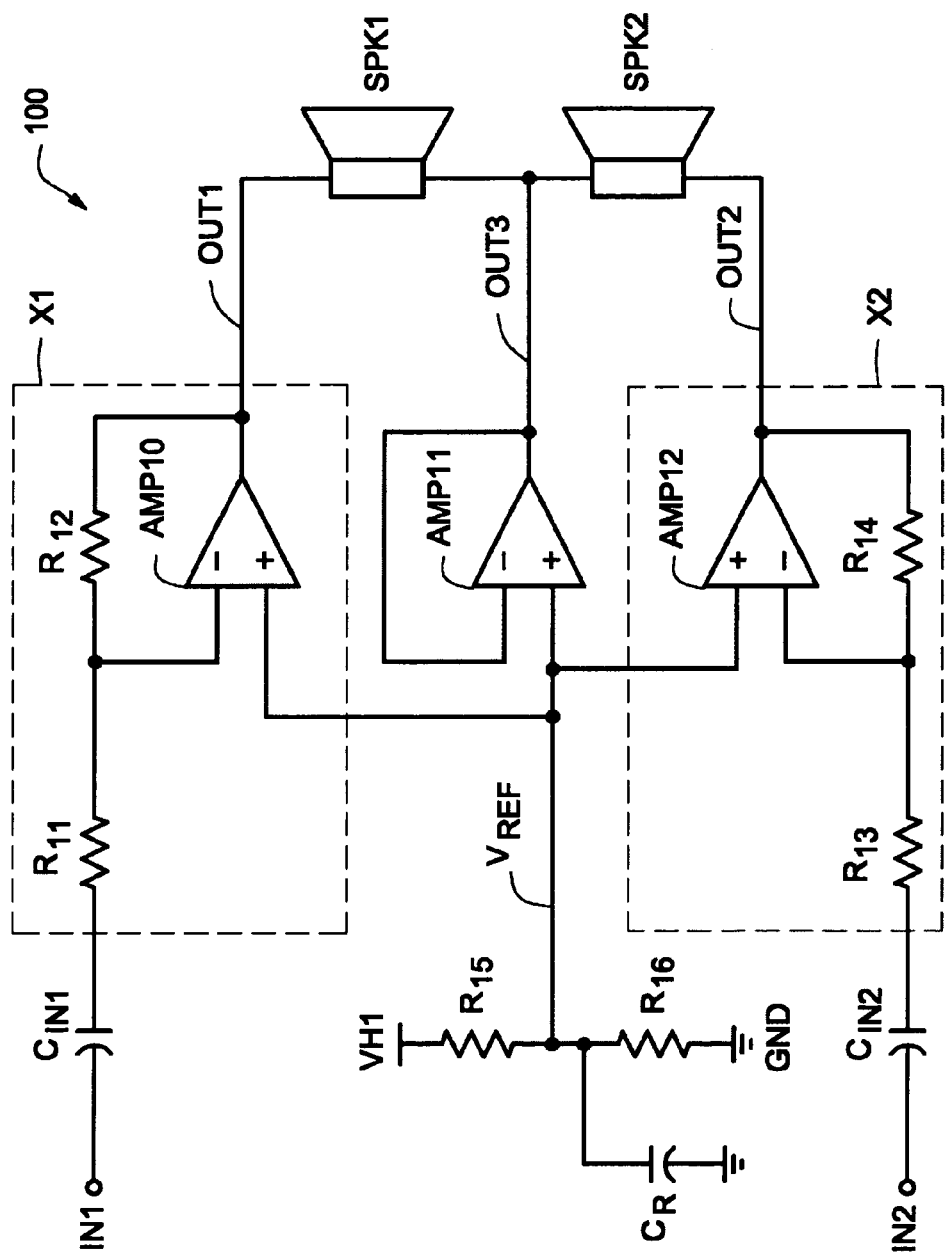
FIG. 1 is a schematic diagram of an audio amplifier system.
Figure 2:
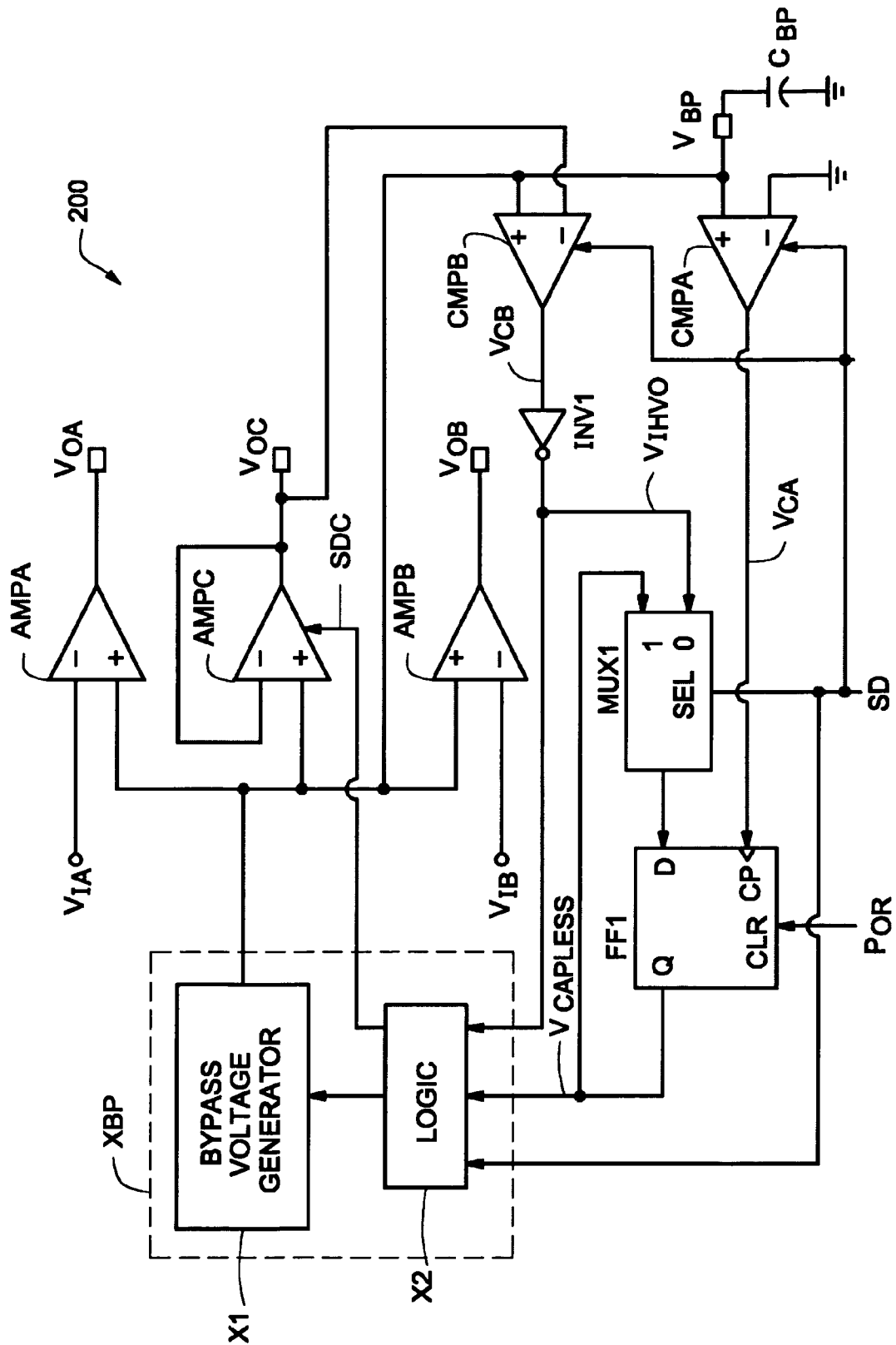
FIG. 2 is a schematic diagram of an audio amplifier system that includes mode control.

FIG. 2 shows a schematic diagram of a two-channel amplifier system (200) in accordance with the present invention. The amplifier system includes three amplifiers (AMPA, AMPB, AMPC), two comparators (CMPA, CMPB), a multiplexer (MUX1), an inverter (INV1), a flip-flop (FF1), a bypass circuit (XBP), and a bypass capacitor (CBP). The bypass circuit includes a bypass voltage generator (X1), and a logic circuit (X2).

The bypass circuit (XBP) cooperates with the bypass capacitor (CBP) to provide a reference voltage (bypass voltage VBP) as is required by the system based on the detected operating mode. Thus, bypass circuit XBP and bypass capacitor CBP operate as a voltage reference circuit (or a means for providing a reference voltage). The non-inverting inputs of the amplifiers (AMPA, AMPB, AMPC), and the non-inverting inputs of the comparators (CMPA, CMPB) are coupled to the bypass voltage (VBP). Amplifier AMPA is arranged to provide an output signal (VOA) in response to an input signal (VIA) and the bypass voltage (VBP). Amplifier AMPB is arranged to provide another output signal (VOB) in response to another input signal (VIB) and the bypass voltage (VBP). Amplifier AMPC is arranged to operate as a unity gain buffer that provides a ground return for DC loads, such that the ground return has a potential that corresponds to the bypass voltage (VBP).

Amplifiers AMPA, AMPB and AMPC are configured to operate in either a DC coupled (or capless) operating mode or an AC coupled (or capacitively coupled) operating mode. In the DC coupled operating mode, amplifiers AMPA and AMPB each provide an amplified signal that is DC coupled to a load in response to signals VIA and VIB, while AMPC is arranged to provide a DC voltage to serve as an AC ground return for the loads. In the AC coupled operating mode, amplifiers AMPA and AMPB each provide an amplified signal that is AC coupled to a load (i.e., via a capacitor), while AMPC is turned off to save power. The output of AMPC is coupled to a circuit ground (i.e., VSS) to select the AC coupled operating mode.

Comparator CMPA provides a high logic output when the bypass voltage exceeds the ground potential by a first predetermined amount. In one example, the first predetermined amount corresponds to 80 mV such that the comparator output will remain as a logic low (logic 0) when the bypass voltage corresponds to a ground signal. In this example, the output of comparator CMPA will change to a high logic level (logic 1) when the bypass voltage is at least 80 mV above the ground potential. Comparator CMPA may be designed to have an internal offset that corresponds to the first predetermined amount.

Comparator CMPB provides a high logic output when the bypass voltage exceeds the output of the third amplifier (VOC) by a second predetermined amount. In one example, the second predetermined amount corresponds to 60 mV such that the comparator output will remain as a logic low (logic 0) when the bypass voltage corresponds to the third output signal. In this example, the output of comparator CMPB will change to a high logic level (logic 1) when the bypass voltage is at least 60 mV above the potential of the third output signal (VOC). Comparator CMPB may be designed to have an internal offset that corresponds to the second predetermined amount.

Comparator circuits CMPA and CMPB are arranged to operate as part of a mode detection circuit (or a means for detecting an operating mode). Additional logic circuits may cooperate with the comparator circuits to condition the various signals for use in the system. For example, inverter logic gate INV1 is arranged to invert the output signal from comparator CMPB. Flip-flop circuit FF1, multiplexer MUX1 and the bypass circuit (XBP) are arranged to cooperate with the outputs of the comparators to provide control of the activation of the amplifier AMPC and control of the bypass voltage (VBP). Multiplexer MUX1 is an optional circuit that is included to provide stable operation during power-up and shutdown of various circuits. Inverter INV1 is arranged to provide an inverse of the output of comparator CMPB to a first input of the multiplexer. The second input of the multiplexer (MUX1) is coupled to the Q output of the flip-flop circuit (FF1). Multiplexer MUX1 selectively couples one of the first and second inputs to the D input of the flip-flop circuit in response to the shutdown (SD) signal. The shutdown signal (SD) is low during normal operating, and high when the system (200) is placed in a shutdown mode. The shutdown (SD) signal is used to disable the amplifier system such that amplifiers AMPA, AMPB, and AMPC are disabled to conserve power.

The shutdown (SD) signal is also used to disable comparators CMPA and CMPB, such that voltages VCA and VCB are initialized to known logic levels, and to prevent the system from getting stuck in an undesired mode. In one example, comparators CMPA and CMPB are initialized to a high logic level (logic 1) when the shutdown (SD) signal is asserted. The initialization of comparators CMPA and CMPB are arranged to prevent unintended latching of the memory circuit (i.e., Flip-flop circuit FF1) due to the feedback paths in the system.

Flip-flop circuit FF1 is an exemplary memory circuit that is arranged to provide a Q output signal in response to the D input when the clock signal (CP) changes. Although flip-flop circuit FF1 is illustrated as a D-type flip-flop circuit, other memory circuits or means for storing the operating mode may be used. Additional logic may be necessary to arrange the memory circuits for proper operation in place of the D-type flip-flop circuit. The flip-flop is reset by a power-on-reset (POR) signal at its CLR terminal, and clocked by the output of comparator CMPA. During non-shutdown operation, the flip-flop circuit receives the inverse of the output of comparator CMPB at the D-input and the output of comparator CMPA at the first input. The output of comparators CMPA, CMPB, and flip-flop circuit FF1 correspond to voltages VCA, VCB, and VCAPLESS, respectively.

As described about, one exemplary memory circuit is a flip-flop circuit that is clocked in response to changes in the output of comparator CMPA. The first predetermined amount is greater than the second predetermined amount such that comparator CMPB has a stable output signal prior to the clocking edge provided by comparator CMPA. In practice, comparators CMPA and CMPB may each have an associated random offset that may impair proper detection of the operating mode of the system. System noise, ground bounce, as well as other system and environmental conditions may also result in ambiguity in evaluating signals with the comparator circuits. For example, amplifier AMPC may have an offset that results in a difference between the bypass voltage (reference voltage) and the voltage associated with the output of amplifier AMPC. The first and second predetermined amounts are chosen such that signal levels are sufficient to overcome the various random offsets, noise, and other sources of ambiguity.

In one example, the first predetermined amount corresponds to 80 mV, and the second predetermined amount corresponds to 60 mV, and the amounts are implemented as internally generated offsets in the comparators. The 60 mV offset in comparator CMPB is sufficient to overcome any random offsets, noise, ground bounce, and other sources of error such that the bypass voltage (reference voltage) is properly compared to the output of amplifier AMPC. Similarly, the 80 mV offset in comparator CMPA is sufficient to overcome any sources of error such that the bypass voltage (reference voltage) is properly compared to the circuit ground. The 20 mV difference in the offset in comparators CMPA and CMPB is provided to ensure that comparator CMPB has sufficient overdrive to properly evaluate the detected operating mode, and to overcome any random offset differences between comparators CMPA and CMPB.

Figure 3:
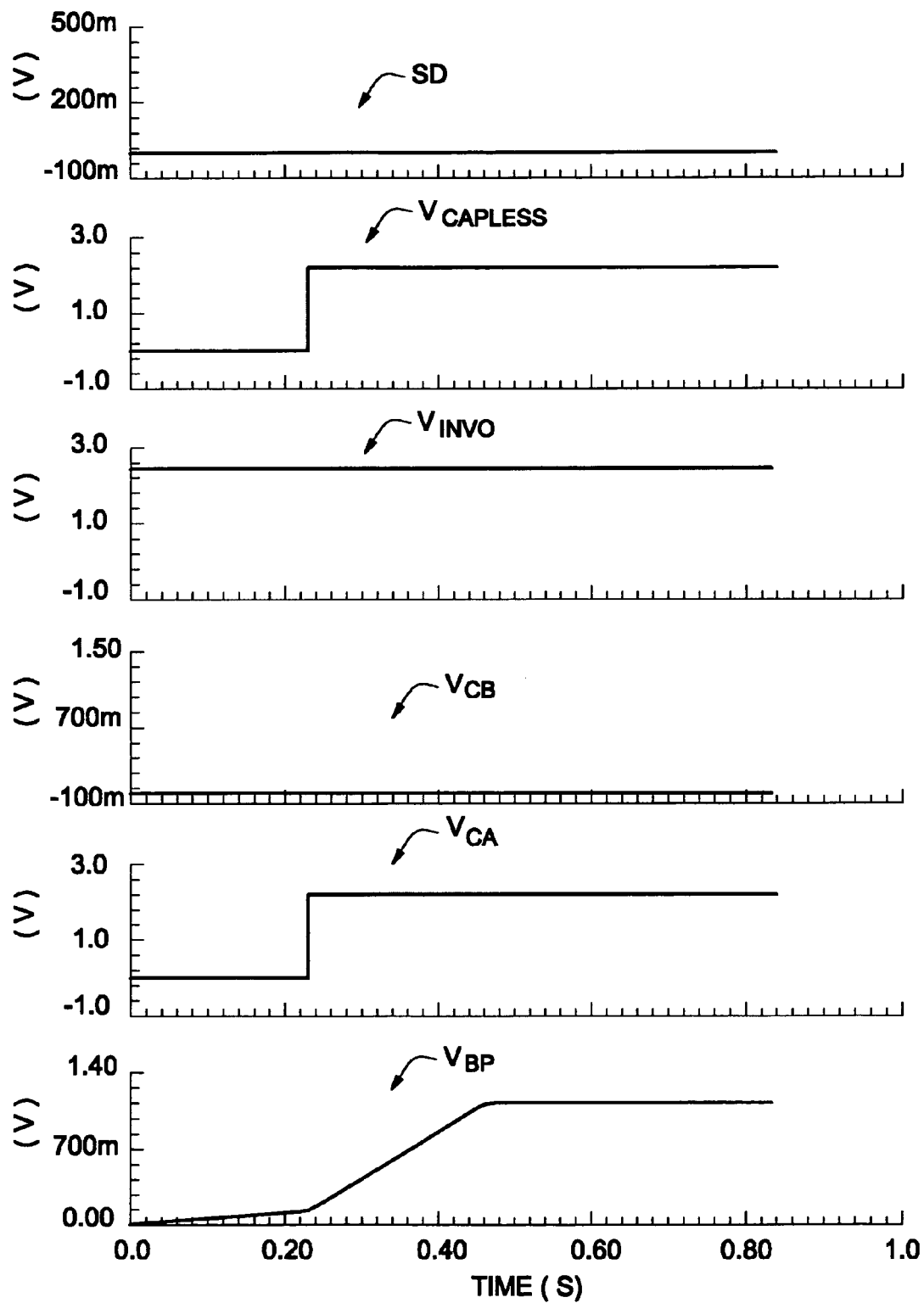
FIG. 3 is a timing diagram of an audio amplifier system that is configured to operate in the DC coupled operating mode.
Figure 4:
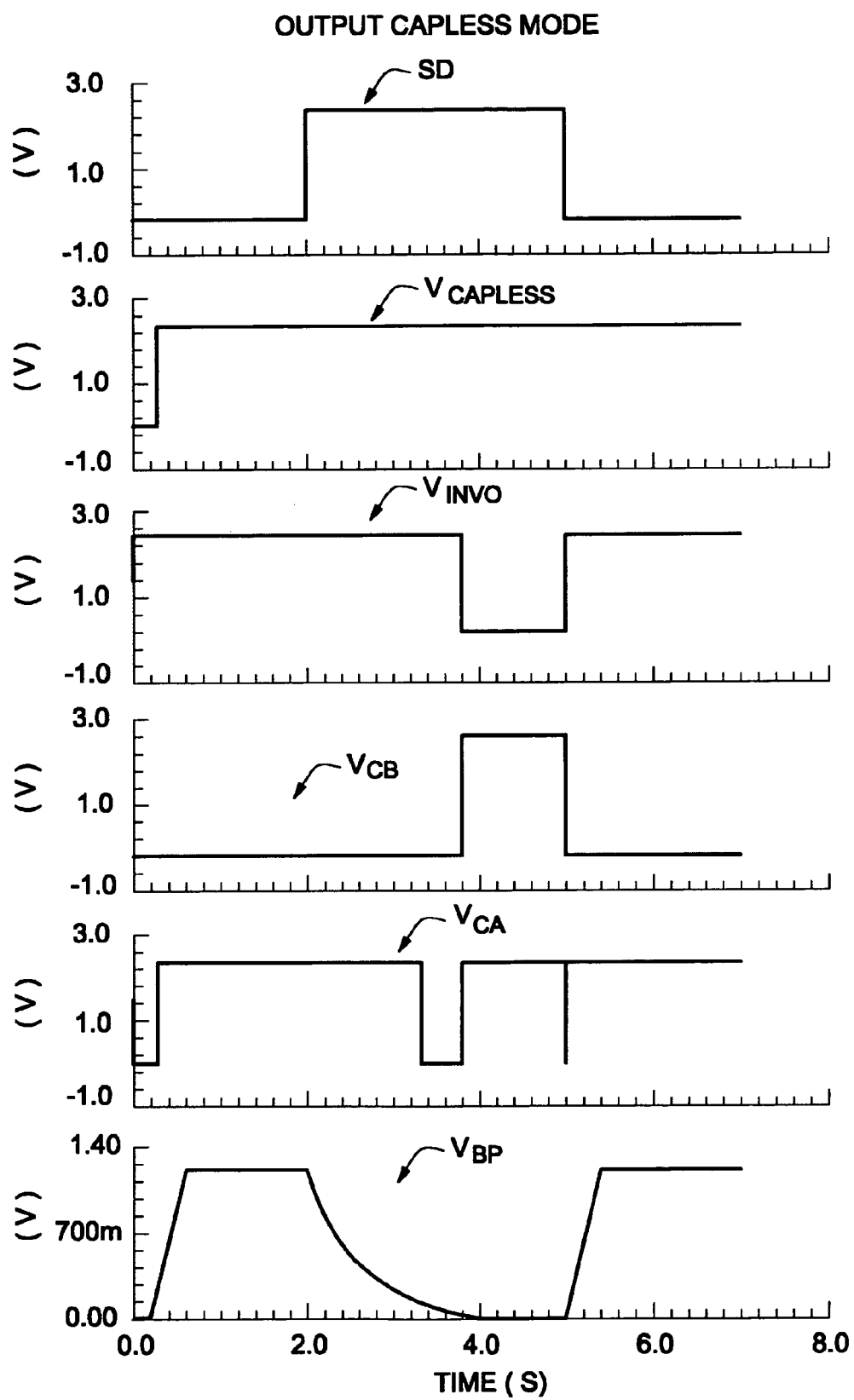
FIG. 4 is another timing diagram of an audio amplifier system that is configured to operate in the DC coupled operating mode.
Figure 5:
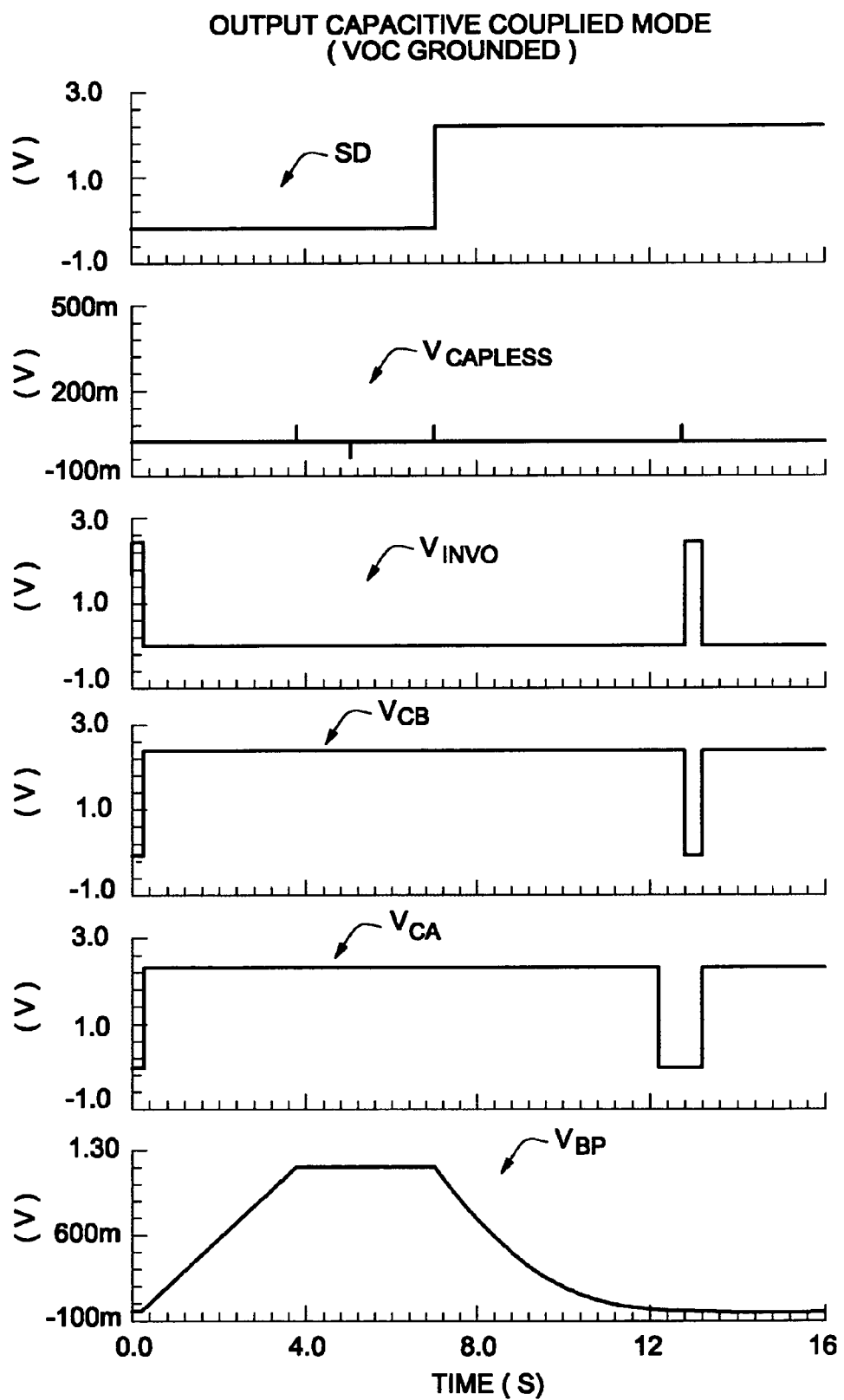
FIG. 5 is a timing diagram of an audio amplifier system that is configured to operate in the AC coupled operating mode.

As stated previously, the output of amplifier AMPC is grounded in the AC (or capacitively) coupled output mode, and AMPC provides a voltage of roughly VBP for the non-capacitively coupled output mode. In one example, amplifier AMPC provides an output signal to an output terminal that is coupled to the loads, and the output terminal is coupled to the circuit ground to select the AC coupled mode. The operation of circuits will be described with reference to FIGS. 3–5. FIGS. 3 and 4 illustrate the DC coupled (or capless) operating mode, while FIG. 5 illustrates the AC coupled (or capacitive coupled) operating mode.

DC Coupled Mode (Output Capless Mode)

Referring to FIG. 3, the operation of amplifier system 200 in the DC coupled (or capless) operating mode is explained as follows below.

In the DC coupled mode, output VOC follows the bypass voltage (VBP). Initially, flip-flop FF1 is cleared by a POR signal (VCAPLESS is at ground), SD is low, and the bypass voltage is at ground (bypass capacitor is discharged). Once the POR signal drops low (logic 0), flip-flop FF1 is free to evaluate the D input when VCA provides a clocking signal.

The bypass capacitor begins to charge as illustrated by a linear ramp of VBP. The linear ramp has an associated slope that is initially determined by a first current level during a first time interval, and later determined by a second current level in a second time interval (see discussion of FIG. 6). The first current level is substantially less than the second current level (i.e., a 10 to 1 relationship). The first time interval corresponds to a time interval where VCAPLESS is logic 0 (capacitive coupled mode), while the second time interval corresponds to a time interval where VCAPLESS is logic 1 (capless mode). The first current level is arranged to charge the bypass capacitor at a slow rate until a determination of the operating mode (AC or DC coupled) can be made. When the system determines that the operating mode is a DC coupled (or capless) mode, the second current level is selected to decrease the charging time of the bypass capacitor and thus improve the start-up time of the amplifiers. The charging of the bypass capacitor is maintained at the first current level when the system detects the operating mode is AC coupled (or capacitively) such that click and pop is minimized.

When the bypass voltage reaches 80 mV, the output of CMPA (VCA) changes from logic 0 to logic 1. Comparator CMPB maintains an output (VCB) of logic 0 since VBP is approximately the same as VOC. VINVO corresponds to the inverse of VCB, and is thus maintained as logic 1. Since SD is low (logic 0) the optional multiplexer couples VINVO (the output of inverter INV1) to the D input of flip-flop circuit FF1. The output (VCAPLESS) of flip-flop circuit FF1 transitions from logic 0 to logic 1 in response to VCB (or VINVO) when VCA provides a clocking edge to the flip-flop circuit (FF1). Thus, flip-flop circuit FF1, comparators CMPA and CMPB, and inverter INV1 operate as a means for detecting the operating mode (in this case DC coupled), and flip-flop circuit FF1 (VCAPLESS) operates as a storage means to store the currently detected operating mode.

Referring now to FIG. 4, the shutdown signal may be activated by the system after the operating mode is detected. For example, the shutdown (SD) signal may be activated to place the amplifier circuits in a low power mode while power is still applied. A discharge circuit (see FIG. 6 and discussion) is arranged to discharge the bypass capacitor when the shutdown signal such that the bypass voltage (VBP) is reduced to the ground potential (i.e., VSS). The output of comparator CMPA (VCA) returns to logic 0 when the bypass voltage drops below 80 mV. However, the optional multiplexer circuit (MUX1) operates as a means to provide positive feedback to flip-flop circuit FF1, such that the D input is coupled to the Q output when the shutdown signal is active. Thus, the flip-flop circuit does not clear during a shutdown cycle and VCAPLESS is maintained as logic 1.

AC Coupled Mode (Output Capacitive Coupled Mode)

Referring to FIG. 5, the operation of amplifier system 200 in the AC coupled (or capacitively coupled) operating mode is explained as follows below.

In the AC coupled mode, output VOC is coupled to a circuit ground potential (i.e., VSS). Initially, flip-flop FF1 is cleared by a POR signal (VCAPLESS is at ground), SD is low, and the bypass voltage is at ground (bypass capacitor is discharged). Once the POR signal drops low (logic 0), flip-flop FF1 is free to evaluate the D input when VCA provides a clocking signal.

The bypass capacitor begins to charge as illustrated by a linear ramp of VBP. The linear ramp has an associated slope that is determined by the first current level as previously described with reference to the DC coupled operating mode. However, the slope of the linear ramp does not change in the AC coupled mode. The first current level is a relatively low current (i.e., 1.8 uA) that is selected in response to the VCAPLESS signal, which corresponds to logic 0 (capacitively coupled mode). The charging of the bypass capacitor is maintained at the first current level when the system detects the operating mode is AC coupled (or capacitively coupled) such that click and pop is minimized.

Since VOC is coupled to ground, the output of CMPB (VCB) changes from logic 0 to logic 1 when the bypass voltage increases to 60 mV. When the bypass voltage reaches 80 mV, the output of CMPA (VCA) changes from logic 0 to logic 1. VINVO corresponds to the inverse of VCB, and is thus maintained as logic 1. Since SD is low (logic 0) the optional multiplexer couples VINVO (the output of inverter INV1) to the D input of flip-flop circuit FF1. The output (VCAPLESS) of flip-flop circuit FF1 latches a logic 0 in the Q output in response to VCB (or VINVO) when VCA provides a clocking edge to the flip-flop circuit (FF1). Thus, flip-flop circuit FF1, comparators CMPA and CMPB, and inverter INV1 operate as a means for detecting the operating mode (in this case AC coupled), and flip-flop circuit FF1 (VCAPLESS) operates as a storage means to store the currently detected operating mode.

The shutdown signal may be activated by the system after the AC operating mode is detected. For example, the shutdown (SD) signal may be activated to place the amplifier circuits in a low power mode while power is still applied. A discharge circuit (see FIG. 6 and discussion) is arranged to discharge the bypass capacitor when the shutdown signal such that the bypass voltage (VBP) is reduced to the ground potential (i.e., VSS). The output of comparator CMPA (VCA) returns to logic 0 when the bypass voltage drops below 80 mV. The output of comparator CMPB (VCB) returns to logic 0 when the bypass voltage drops below 60 mV. However, the optional multiplexer circuit (MUX1) operates as a means to provide positive feedback to flip-flop circuit FF1, such that the D input is coupled to the Q output when the shutdown signal is active. Thus, the flip-flop circuit does not clear during a shutdown cycle and VCAPLESS is maintained as logic 0.

In the DC coupled operating mode (Output Capless Mode), the bypass capacitor discharged at a first discharge rate as illustrated in FIG. 4. In contrast, the bypass capacitor is discharged at a second discharge rate when the operating mode corresponds to the AC coupled operating mode (Output Capacitively Coupled Mode) as illustrated in FIG. 5. The second discharge rate is slower than the first discharge rate such that minimum click and pop is present in the output of amplifiers AMPA and AMPB, respectively.

Start-Up Transients

Amplifiers AMPA and AMPB include non-inverting inputs that are coupled to a reference voltage that corresponds to the bypass voltage (VBP). VBP ideally is set to half of the supply voltage (i.e., VDD/2) to ensure maximum signal swing in the amplifiers. The amplifiers will strive to equalize the voltages at the inverting and non-inverting inputs by driving the output voltages (VOA, VOB).

Input coupling capacitors (i.e., CIA, CIB (not shown)) are used to isolate the DC levels of the signal sources for VIA and VIB from the DC levels of the inverting inputs of amplifiers AMPA and AMPB. During initial power turn-on, the capacitors (CBP, CIA, CIB) are discharged to GND. After power turn-on, capacitors CIA (not shown), CIB (not shown) and CBP must charge up to VBP.

Due to differences in impedances, component tolerances and other related circuit components, the capacitors (CREF, CA, CB) do not charge at the same rates. The difference in the charging rates causes a difference in the DC levels of the input terminals of the amplifiers. Since the amplifiers are configured to provide gain, the differences in the input terminals are amplified and may appear in the speaker or headphone output signals (VOA, VOB). Non-audio signal differences in the input terminals of the op-amps cause clicks and pops in the output to the speaker or headphones.

Bypass Circuit

Figure 6:
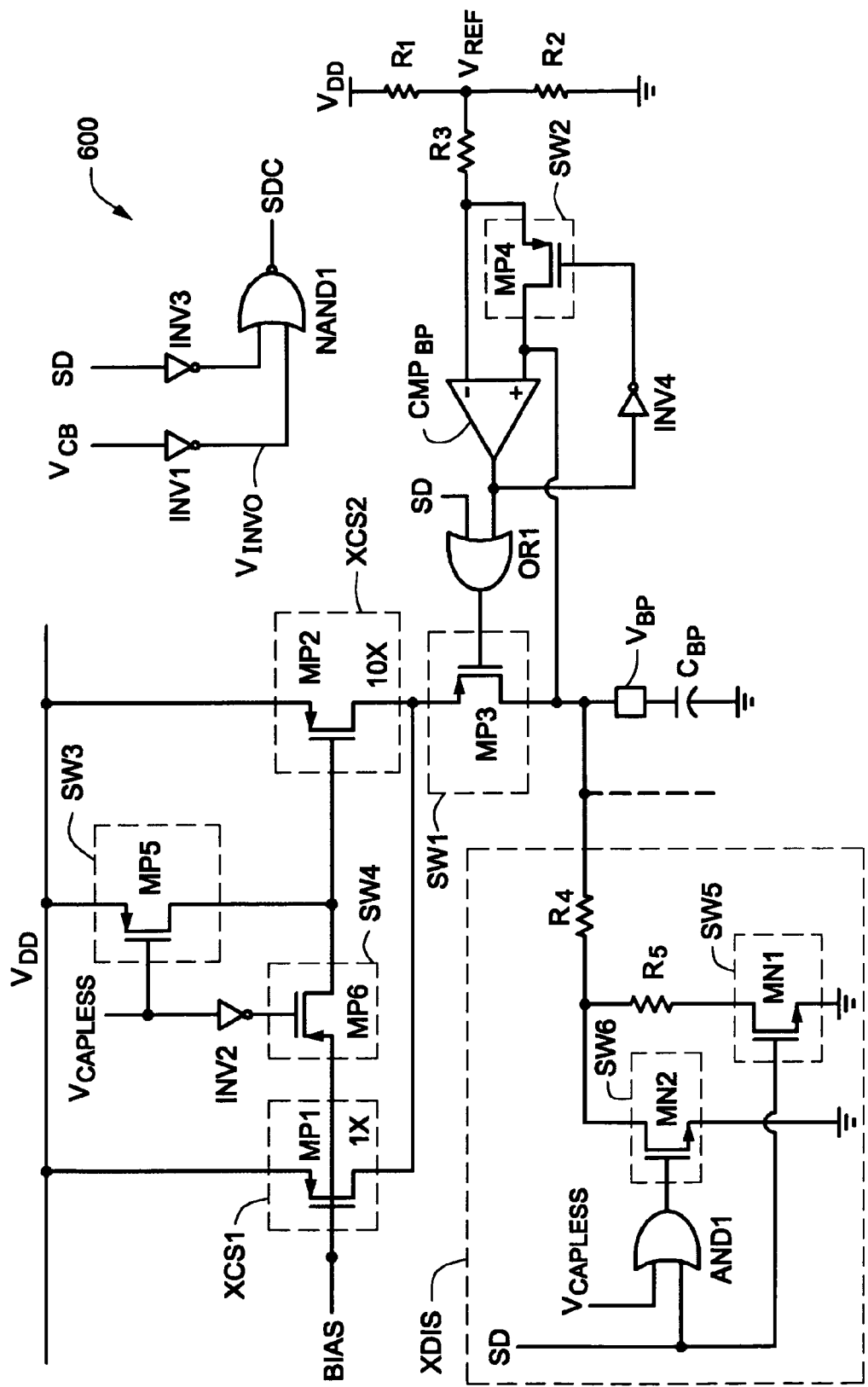
FIG. 6 is a schematic diagram of an exemplary bypass circuit, in accordance with the present invention.

FIG. 6 shows a schematic diagram of an exemplary bypass circuit (600) that is in accordance with the present invention. The bypass circuit (600) includes a comparator (CMPBP), three resistors (R1–R3), four switching circuits (SW1–4), two current sources (XCS1–2), five logic gates (INV2–4, NAND1, OR1), and a discharge circuit (XDIS). Discharge circuit XDIS includes two switching circuits (SW5–6), two resistors (R4–5), and a logic gate (AND1). The bypass capacitor (CBP) from FIG. 2 is included in the figure to illustrate the operation of the bypass circuit.

Switching circuits SW1–6 may be implemented using any circuit arrangement that provides an appropriate switching function. For example, switching circuits SW1–4 may be implemented as P-type field effect transistors (MP3–MP5), while switching circuits SW5–6 may be implemented as N-type field effect transistors (MN1–MN2). Additional logic may be necessary to provide proper functionality when the switching circuits are implemented in another arrangement.

Resistors R1 and R2 form a voltage divider across the power supply (VDD) to provide a reference voltage (VREF). In one example the reference voltage (VREF) corresponds to half of the power supply voltage when R1 and R2 have equal values. The reference voltage (VREF) is coupled to the inverting input of comparator CMPBP through resistor R3, while the non-inverting input of comparator CMPBP is coupled to the bypass voltage (VBP). Comparator CMPBP includes hysteresis (i.e., 40 mV) such that comparator CMPBP provides a logic 1 output when the bypass voltage exceeds the reference voltage by a predetermined amount, and comparator CMPBP provides a logic 0 output when the reference voltage exceeds the bypass voltage by another predetermined amount. The hysteresis may be arranged to compensate for inherent offset within comparator CMPBP, as well as other sources of offset within the system. Also, the hysteresis may be arranged to prevent oscillations in the output of comparator CMPBP, which may otherwise result due to the actuation of SW1 creating a charging and discharging cycle on capacitor CBP.

Logic gate INV4 is arranged to provide an inverse of the output of comparator CMPBP to switching circuit SW2. Switching circuit SW2 is activated when the output of comparator CMPBP corresponds to logic 1 (i.e., when VBP reaches VREF). Switching circuit SW2 is arranged to couple the inverting and non-inverting inputs of comparator CMPBP together when active such that the output of comparator CMPBP is maintained at logic 1. The output of comparator CMPBP changes from a logic 1 to a logic 0 when VBP drops below VREF by a predetermined amount corresponding to the hysteresis.

Current source XCS1 is arranged to provide a first current to the bypass capacitor when switching circuit SW1 is active. Current source XCS2 is arranged to provide a second current to the bypass capacitor when switching circuit SW1 is active and the operating mode corresponds to the DC coupled operating mode as indicated by VCAPLESS being a logic 1 signal. In one example the first current corresponding to a unit current, and the second current corresponds to ten times the unit current. In this example, the bypass capacitor is charged by the unit current when VCAPLESS is a logic 0 signal, and the bypass capacitor is charged by eleven (11) times the unit current when VCAPLESS is a logic 1 signal.

Current sources XCS1 and XCS2 may be implemented using any circuit arrangement that provides an appropriate current source function. For example, current sources XCS1 and XCS2 may be implemented as P-type field effect transistors MP1 and MP2. In this example, transistor MP1 is biased by bias line BIAS, while transistor MP2 is selectively biased by bias line BIAS when the VCAPLESS signal corresponds to logic 1. Inverter circuit INV2 and switching circuits SW3 and SW4 are arranged to disable current source XCS2 when the VCAPLESS signal corresponds to logic 0.

Typically, switching circuit SW1 is activated when the bypass voltage (VBP) is less than the reference voltage (VREF), and deactivated when the bypass voltage (VBP) is equal to the reference voltage (VREF). Current sources XCS1 and XCS2 are selectively coupled to the bypass capacitor when the bypass voltage is less than the reference voltage. Switching circuit SW1 operates as a means for coupling charging currents to the bypass capacitor, and the bypass capacitor operates as a means for storing charge from the charging currents.

Logic gate OR1 is arranged to provide an override when the shutdown (SD) signal is active. SW1 is disabled when the SD signal is active, and SW1 is actuated in response to the output of comparator CMPBP when the SD signal is inactive.

Discharge circuit XDIS is arranged to discharge the bypass capacitor to a circuit ground potential when the shutdown (SD) signal is active. Switching circuits SW5, SW6 and logic gate AND1 are arranged to operate as a discharge control circuit such that the rate of discharge is adjustable. In one example, the bypass capacitor is coupled to the circuit ground through the series combination of resistors R4 and R5 via switching circuit SW5 when switching circuit SW5 is active. In another example, the bypass capacitor is coupled to the circuit ground through resistor R4 via switching circuit SW6 when switching circuit SW6 is active. Resistors R4 and R5 determined the discharge rate of the bypass capacitor. Switching circuit SW5 is active when the shutdown (SD) signal is active, while switching circuit SW6 is active when both the shutdown signal (SD) and VCAPLESS are active (logic 1).

Logic gates NAND1 and INV3 are arranged to operate as a disable circuit (i.e., a means for disabling) that selectively disables amplifier AMPC in FIG. 2. Signal SDC corresponds to logic 1 when shutdown (SD) corresponds to logic 1, or when the output (VCB) of comparator CMPB corresponds to logic 1. Also, signal SDC corresponds to logic 0 when shutdown (SD) corresponds to logic 0, and when VCB corresponds to logic 0.

Amplifier AMPC from FIG. 2 is only enabled when the shutdown AMPC signal (SDC) corresponds to logic 0. As previously stated, VCB corresponds to logic 1 when the bypass voltage exceeds VOC (the output of amplifier AMPC) by a predetermined amount such as 60 mV. Thus, amplifier AMPC is disabled when VOC is coupled to the circuit ground potential and the bypass voltage (VBP) exceeds the predetermined amount (i.e. 60 mV), or when the shutdown signal (SD) is active.

In one example, the output of amplifier AMPC is short circuited after the operating mode is determined. In this example, amplifier AMPC is disabled by the SDC signal when the short circuit condition occurs. Thus, the various logic gates and comparator CMPBP provide output short circuit protection.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus, comprising:
a first amplifier that is configured to amplify an input signal to provide an output signal;
a reference voltage circuit that is configured to selectively provide a reference voltage, wherein the reference voltage is generated by providing a charging current to a capacitor such that the capacitor charges to a desired voltage level;
a buffer amplifier that is configured to receive the reference voltage and selectively provide a ground return for the output signal that corresponds to the reference voltage when the buffer amplifier is activated; and
a terminal that is coupled to the buffer amplifier such that a voltage associated with the terminal corresponds to the reference voltage when the buffer amplifier is activated; and
a mode detection circuit that is arranged to monitor the reference voltage, monitor the voltage associated with the terminal, and determine an operating mode by evaluating the voltage associated with the terminal when the reference voltage reaches a predetermined level, wherein the operating mode corresponds to a AC coupled operating mode when the terminal is coupled to a circuit ground, and the operating mode corresponds to a DC coupled operating mode when the reference voltage exceeds the voltage associated with the terminal.

2. An apparatus as in claim 1, wherein the first amplifier is coupled to the reference voltage such that the reference voltage provides a bias to the first amplifier, and the bias is isolated from the output signal when the first amplifier is configured in the AC coupled operating mode.

3. An apparatus as in claim 1, wherein the first amplifier is coupled to the reference voltage such that the reference voltage provides a bias to the first amplifier, and the bias is included in the output signal when the first amplifier is configured in the DC coupled operating mode.

4. An apparatus as in claim 1, further comprising a second amplifier that is configured to amplify another input signal to provide another output signal, wherein the output signal and the input signal correspond to a first half of a stereo signal, and the other output signal and the other input signal corresponds to a second half of a stereo signal.

5. An apparatus as in claim 1, the mode detection circuit further comprising a first comparator circuit that is arranged to provide a first comparator output signal in response to the reference voltage and a circuit ground potential, and a second comparator circuit that is arranged to provide a second comparator output signal in response to the reference voltage and the voltage associated with the terminal, wherein the first comparator output signal indicates the detected operating mode, and the second comparator output signal provides a timing signal that indicates an appropriate time to evaluate the detected operating mode.

6. An apparatus as in claim 5, the mode detection circuit further comprising a memory circuit that is arranged to evaluate the first comparator output signal when clocked by the timing signal such that the detected operating mode is latched in the memory circuit.

7. An apparatus as in claim 6, wherein the memory circuit corresponds to a flip-flop circuit.

8. An apparatus as in claim 5, the mode detection circuit further comprising a memory circuit that is arranged to evaluate the first comparator output signal when clocked by the second comparator output signal such that the detected operating mode is latched in the memory circuit, and a feedback circuit that is arranged to provide positive feedback between an output of the memory circuit and an input of the memory circuit when a shutdown signal is activated.

9. An apparatus as in claim 8, wherein the feedback circuit includes a multiplexer circuit that is arranged to couple the output of the memory circuit to the input of the memory circuit when the shutdown signal is activated, wherein the multiplexer circuit is arranged to couple the first comparator output to the input of the memory circuit when the shutdown signal is deactivated.

10. An apparatus as in claim 5, wherein the first comparator circuit is arranged to assert the first comparator output signal as a first logic level when the reference voltage exceeds the circuit ground potential by a first predetermined amount, and assert the first comparator output signal at a second logic level when the reference voltage fails to exceed the circuit ground potential by the first predetermined amount, wherein the first logic level corresponds to an inverse of the second logic level and the predetermined level is related to the first predetermined amount.

11. An apparatus as in claim 10, wherein the first predetermined amount corresponds to an offset voltage that is intentionally provided within the first comparator circuit.

12. An apparatus as in claim 5, wherein the second comparator circuit is arranged to assert the second comparator output signal as a first logic level when the reference voltage exceeds the voltage associated with the terminal by a second predetermined amount, and assert the second comparator output signal at a second logic level when the reference voltage fails to exceed the voltage associated with the terminal by the second predetermined amount, wherein the first logic level corresponds to an inverse of the second logic level.

13. An apparatus as in claim 12, wherein the second predetermined amount corresponds to an offset voltage that is intentionally provided within the second comparator circuit.

14. An apparatus as in claim 1, the mode detection circuit further comprising a logic circuit, wherein the logic circuit is arranged to disable the buffer amplifier when the reference voltage exceeds the voltage associated with the terminal by a predetermined amount, wherein the logic circuit is also arranged to disable the buffer amplifier when a shutdown signal is asserted, such that the buffer amplifier is protected from short circuit conditions.

15. An apparatus as in claim 1, the reference voltage circuit further comprising a first current source that is selectively coupled to the capacitor, and a second current source that is selectively coupled to the capacitor, wherein the first current source provides a first charging current to the capacitor when the reference voltage is less than the desired voltage level, and wherein the second current source provides a second charging current to the capacitor when the operating mode corresponds to a DC coupled operating mode and the reference voltage is less than the desired voltage level.

16. An apparatus as in claim 15, wherein the second charging current is related to the first charging current by a factor of ten.

17. An apparatus as in claim 1, further comprising a discharge circuit that is arranged to discharge the capacitor at a first rate when a shutdown signal is activated and the operating mode corresponds to the DC coupled operating mode, and discharge circuit is arranged to discharge the capacitor at a second rate when the shutdown signal is activated and the operating mode corresponds to the AC coupled operating mode.

18. A method for controlling a coupling mode in an amplifier, comprising:
    charging a capacitor when a voltage associated with the capacitor is below a desired voltage level;
    coupling the voltage associated with the capacitor to an input of a buffer;
    enabling the buffer during a start-up condition;
    providing a buffered voltage to a terminal when the buffer is enabled, wherein the buffered voltage is related to the voltage associated with the capacitor, and the buffered voltage operates as a ground return for the amplifier through the terminal;
    comparing the voltage associated with the capacitor to a voltage associated with the terminal;
    activating an AC coupled indicator when the voltage associated with capacitor exceeds the voltage associated with the terminal by a first predetermined amount;
    activating a DC coupled indicator when the voltage associated with capacitor fails to exceed the voltage associated with the terminal by the first predetermined amount;
    disabling the buffer when the AC coupled indicator is active;
    evaluating the coupling mode when the voltage associated with the capacitor exceeds a circuit ground by a second predetermined amount;
    detecting an AC coupled mode when the AC coupled indicator is active and the coupling mode is evaluated; and
    detecting a DC coupled mode when the DC coupled indicator is active and the coupling mode is evaluated.

19. An apparatus for controlling a coupling mode in an amplifier, comprising:
    a means for charging that is arranged to charge a capacitor when a voltage associated with the capacitor is below a desired voltage level;
    a means for buffering that is arranged to selectively provide a buffered voltage to a terminal when the means for buffering is activated, wherein the buffered voltage is related to the voltage associated with the capacitor, and the buffered voltage operates as a ground return for the amplifier through the terminal;
    a means for enabling that is arranged to activate the means for buffering during a start-up condition;
    a means for comparing that is arranged to compare the voltage associated with the capacitor to a voltage associated with the terminal;
    a means for activating that is arranged to activate an AC coupled indicator when the voltage associated with capacitor exceeds the voltage associated with the terminal by a first predetermined amount, and wherein the means for activating is arranged to activate a DC coupled indicator when the voltage associated with capacitor fails to exceed the voltage associated with the terminal by the first predetermined amount;
    a means for disabling that is arranged to disable the buffer when the AC coupled indicator is activated; and
    a means evaluating that is arranged to evaluate the coupling mode when the voltage associated with the capacitor exceeds a circuit ground by a second predetermined amount, wherein the coupling mode is determined as an AC coupled mode when the AC coupled indicator is evaluated as active, and wherein the coupling mode is determined as a DC coupled mode when the DC coupled indicator is evaluated as active.

20. An apparatus as in claim 19, further comprising a means for discharging that is arranged to discharge the capacitor when a shutdown signal is activated, and wherein the means for disabling is further arranged to disable the buffer when the shutdown signal is activated.

* * * * *